(12) United States Patent
Yuuya

(10) Patent No.: US 7,618,551 B2
(45) Date of Patent: Nov. 17, 2009

(54) PIEZOELECTRIC CERAMIC AND METHOD OF MANUFACTURING THE SAME

(75) Inventor: Shigenori Yuuya, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 248 days.

(21) Appl. No.: 11/727,807

(22) Filed: Mar. 28, 2007

(65) Prior Publication Data

US 2007/0228318 A1 Oct. 4, 2007

(30) Foreign Application Priority Data

Mar. 31, 2006 (JP) ............................ 2006-100464

(51) Int. Cl.
C04B 35/495 (2006.01)
H01L 41/187 (2006.01)
H01L 41/24 (2006.01)

(52) U.S. Cl. .................. 252/62.9 R; 252/62.9 PZ; 310/311; 264/653; 501/134

(58) Field of Classification Search ............ 252/62.9 R, 252/62, 9 PZ; 310/311; 264/653; 501/134
See application file for complete search history.

(56) References Cited

U.S. PATENT DOCUMENTS

| 5,180,699 A | * | 1/1993 | Terada et al. ................. 501/134 |
| 6,093,339 A | * | 7/2000 | Kimura et al. ........... 252/62.9 R |
| 2003/0178606 A1 | * | 9/2003 | Nonoyama et al. .......... 252/500 |

FOREIGN PATENT DOCUMENTS

| JP | 11-60333 A | 3/1999 |
| JP | 2002-193663 A | 7/2002 |
| JP | 2003-342069 A | 12/2003 |

OTHER PUBLICATIONS

Yiping Guo, et al., "Phase transitional behavior and piezoelectric properties of $(Na_{0.5}K_{0.5})NbO_3$-$LiNbO_3$ ceramics", Applied Physics Letters, Nov. 2004, pp. 4121-4123, vol. 85, No. 18, Nagoya Institute of Technology, Nagoya, Japan.

Tadashi Takenaka, "Grain Orientation of Bismuth Layered-structure Ferroelectric Ceramics and Application to Piezoelectric and Pyroelectric Materials", Kyoto University Doctor of Engineering Dissertation, 1985, pp. 101-124.

Yasuyoshi Saito, et al., "Lead-free piezoceramics", Letter to Nature, Nature 432, Nov. 2004, pp. 84-87.

* cited by examiner

Primary Examiner—C. Melissa Koslow
(74) Attorney, Agent, or Firm—Sughrue Mion, PLLC

(57) ABSTRACT

Piezoelectric performance is improved in a piezoelectric ceramic having a perovskite-type crystal structure expressed by a general formula $ABO_3$ and the B-site element including niobium. The piezoelectric ceramic has a perovskite-type crystal structure in which plural octahedrons formed of oxygen are arranged to share vertices thereof and elements are located at a center of eight octahedrons and at a center of each octahedron; wherein an element located at the center of eight octahedrons is A-site element, an element located at the center of each octahedron is B-site element, and a general formula of the perovskite-type crystal structure is $ABO_3$; the B-site element includes niobium (Nb); and bismuth (Bi) content in composition of the piezoelectric ceramic is 100 ppm by weight or less.

9 Claims, 5 Drawing Sheets

| | DEGREE OF ORIENTATION | BISMUTH CONTENT (ppm by weight) | PIEZOELECTRIC CONSTANT $d_{33}$ (pm/V) |
|---|---|---|---|
| WORKING EXAMPLE 1-1 | 81% | 10 | 380 |
| WORKING EXAMPLE 1-2 | 65% | 1.5 | 350 |
| WORKING EXAMPLE 2-1 | 78% | 50 | 340 |
| WORKING EXAMPLE 2-2 | 62% | 3.5 | 320 |
| WORKING EXAMPLE 3-1 | 0% | Less than 0.1 | 250 |
| COMPARATIVE EXAMPLE 1-1 | 85% | 320 | 230 |
| COMPARATIVE EXAMPLE 1-2 | 55% | 120 | 180 |

FIG.4

|  | DEGREE OF ORIENTATION | BISMUTH CONTENT (ppm by weight) | PIEZOELECTRIC CONSTANT $d_{33}$ (pm/V) |
|---|---|---|---|
| WORKING EXAMPLE 1-1 | 81% | 10 | 380 |
| WORKING EXAMPLE 1-2 | 65% | 1.5 | 350 |
| WORKING EXAMPLE 2-1 | 78% | 50 | 340 |
| WORKING EXAMPLE 2-2 | 62% | 3.5 | 320 |
| WORKING EXAMPLE 3-1 | 0% | Less than 0.1 | 250 |
| COMPARATIVE EXAMPLE 1-1 | 85% | 320 | 230 |
| COMPARATIVE EXAMPLE 1-2 | 55% | 120 | 180 |

PIEZOELECTRIC CERAMIC AND METHOD OF MANUFACTURING THE SAME

BACKGROUND OF THE INVENTION

1. Field of the Invention

The present invention relates to a piezoelectric ceramic as a material of piezoelectric element applied to a piezoelectric actuator, ultrasonic transducer, and so on, and a method of manufacturing the piezoelectric ceramic, and specifically, to a (lead-free) piezoelectric ceramic containing no lead in the composition and a method of manufacturing the piezoelectric ceramic.

2. Description of a Related Art

Conventionally, a piezoelectric material, which expands and contracts when applied with an electric field and generates an electric signal when applied with pressure, has been widely used. As representative application examples of the piezoelectric material, an actuator in an inkjet head, a transducer for transmitting and receiving ultrasonic waves in an ultrasonic probe, and so on are known.

As piezoelectric materials, piezoelectric ceramics represented by PZT (Pb(lead) zirconate titanate: $PbTiO_3$—$PbZrO_3$), polymer piezoelectric materials represented by PVDF (polyvinylidene-fluoride), and so on are cited. Of the materials, PZT has most widely spread in view of high properties such as piezoelectric constant and electromechanical coupling factor, price, easy handling, and so on.

However, recent years, the toxicity of lead (Pb) contained in PZT has become problematic because lead is hazardous to humans and also causes environmental pollution. Accordingly, the development of a piezoelectric material containing no lead in composition (lead-free piezoelectric material) is being advanced.

Now, a perovskite-type crystal as a main crystal structure of a piezoelectric ceramic such as PZT will be explained. The perovskite-type crystal structure (general formula: $ABO_3$) has a structure in which plural octahedrons formed of oxygen are arranged to share vertices thereof (a corner-sharing structure). Further, elements are located near the center (A-site) of eight octahedrons arranged in that manner and at the center (B-site) of each octahedron. Typically, in an oxide having a high piezoelectric property like PZT, the elements located at the A-sites (A-site elements) include lead. Further, among lead-free piezoelectric oxides, oxides in which the elements located at the B-sites (B-site elements) including niobium (Nb) exhibits a relatively high piezoelectric properties.

As lead-free piezoelectric materials, for example, $(Bi_{0.5}Na_{0.5})TiO_3$, $(K_{0.5}Na_{0.5})NbO_3$, $KNbO_3$, and so on are known. However, while typical PZT exhibits the piezoelectric constant $d_{33}$ of about 400 pm/V to 600 pm/V and relaxor PZT exhibits the piezoelectric constant $d_{33}$ of about 600 pm/V to 950 pm/V, the lead-free piezoelectric material exhibits at most the piezoelectric constant $d_{33}$ of about 80 pm/V to 120 pm/V. The piezoelectric constant reaches at the highest to 160 pm/V in a hot-pressed high-density sintered material. Therefore, in the present circumstances, the lead-free piezoelectric material is inferior to PZT in performance and not highly practical.

By the way, study for improving the properties of piezoelectric ceramics has been made principally from the three viewpoints of (1) control of crystal system and composition, (2) optimization of microstructure such as crystal size, voids, internal distortion, and (3) control of crystal orientation.

For example, as an example of the viewpoint (1), Guo et al., "Phase transitional behavior and piezoelectric properties of $(Na_{0.5}K_{0.5})NbO_3$—$LiNbO_3$ ceramics", APPLIED PHYSICS LETTERS, VOLUME 85, NUMBER 18, 1 Nov. 2004, pp. 4121-4123 discloses that, although the piezoelectric constant $d_{33}$ of $(K_{0.5}Na_{0.5})NbO_3$ is about 100 pm/V, the piezoelectric constant of 235 pm/V is obtained by substituting and solid-solving lithium (Li) for the A-side.

Further, as a related technology, Japanese Patent Application Publication JP-P2003-342069 discloses a piezoelectric ceramic composition expressed by the general formula $\{Li_x(K_{1-y}Na_y)_{1-x}\}(Nb_{1-z}Sb_z)O_3$, given that x, y, z fall within the composition range of $0 \leq x \leq 0.2$, $0 \leq y \leq 1.0$, and $0 \leq z \leq 0.2$ (except for x=z=0). In JP-P2003-342069, the property of piezoelectric ceramic composition (ceramic) is improved from the viewpoint (1).

On the other hand, Japanese Patent Application Publication JP-A-11-60333 discloses a piezoelectric ceramic including a perovskite-type ceramic containing a rhombohedral crystal as a main phase and a crystal orientation ceramic with {100} face in pseudocubic expression oriented, and further having a degree of orientation of 30% or more according to the Lotgering method. That is, in JP-A-11-60333, the property of the piezoelectric ceramic is improved from the viewpoint (3).

Further, Takenaka, "Grain Orientation of Bismuth Layered-structure Ferroelectric Ceramics and Application to Piezoelectric and Pyroelectric Materials", Kyoto University Doctor of Engineering Dissertation, 1985, pp. 101-124 shows a relationship between the degree of orientation and the electromechanical coupling factor of the crystal in $Bi_{3.3}Pb_{0.7}Ti_{2.3}Nb_{0.7}O_{12}$ as a lead-containing piezoelectric ceramic. That is, in the range of the degree of orientation of 60% or more, the electromechanical coupling factor rises steeply with larger degree of orientation.

Therefore, in order to improve the property of a piezoelectric ceramic, control of crystal orientation may have great potential.

As a method of manufacturing an orientation-controlled ceramic, for example, TGG (Templated Grain Growth) method is known. The TGG method is a method of employing plate-like crystal grains having anisotropic crystal structures as a precursor to fabricate a compact, in which grains are oriented, according to the green sheet method, and sintering the compact at normal pressure to obtain crystal sintered material oriented along to the orientation of the plate-like grains.

The green sheet method is a method of obtaining a thick film-like compact by rolling slurry, which has been obtained by mixing organic binder, organic solvent, or the like in ceramic powder, on a carrier film by using a doctor blade device or the like. Employing plate-like grains as ceramic powder in the green sheet method enables fabrication of the compact in which the plate-like grains are oriented by the shear stress at the time of application.

However, in the TGG method, the plate-like grains to be used as a precursor are generally obtained only from crystals with large anisotropy, and therefore, the material system is restrained. Further, any material as a lead-free material with large anisotropy and a large piezoelectric property is not known at present. In the case of using the TGG method in which the crystal structures in plate-like grains are reflected to the final product, fabrication of a piezoelectric ceramic with high performance is difficult.

Accordingly, such TGG method has been improved to develop RTGG (Reactive Templated Grain Growth) method as a technology capable of forming an isotropic perovskite structure. The RTGG method is a method of generating plate-like grains having anisotropic crystal structures such as layered perovskite material, molding the plate-like grains with reactants to fabricate oriented compact containing the plate-like grains, heat-treating it to transform the anisotropic crystal structures into pseudo-equiaxial crystals, and further sintering it for grain growth.

As a related technology, Japanese Patent Application Publication JP-P2002-193663 discloses a sintered material of crystal oriented perovskite-type compound of double oxide expressed by the general formula $ABO_3$, where A is a divalent metal element and B is a tetra-valent metal element. In JP-P2002-193663, a sintered material composition of a crystal oriented perovskite-type compound as a grain oriented growth structure of a lead-free piezoelectric ceramic is obtained by using an improved RTGG method. Barium titanate is cited as a specific lead-free piezoelectric ceramic.

Further, Saito et al., "Lead-free piezoceramics", Nature 432, 4 Nov. 2004, pp. 84-87 also discloses a method of manufacturing a piezoelectric ceramic as an improved RTGG method. The method of manufacturing a piezoelectric ceramic includes generating plate-like grains having anisotropic crystal structures (the first precursor) (step 1), heat-treating the plate-like grains with reactants in flux to transform the anisotropic crystal structures into pseudo-equiaxial crystals while keeping the plate-like grains (step 2), molding the plate-like grains of pseudo-equiaxial crystals (the second precursor) with additives to fabricate an oriented compound containing the plate-like grains (step 3), and sintering the oriented compound (step 4).

Furthermore, Saito et al. also discloses that a piezoelectric effect (an electric-field-induced strain) comparable to that of typical actuator-grade PZT is achieved through the combination of the discovery of a morphotropic phase boundary in an alkaline niobate-based perovskite solid solution and the development of a method of highly orienting the polycrystal at direction <001>.

Here, as an anisotropic crystal from which plate-like grains are easily obtained, bismuth (Bi) layered oxide (layered perovskite crystal) is known. The Bi layered oxide refers to a compound containing a sheet-like oxide (perovskite block layer) having an octahedron structure with vertices of oxygen elements and Bi—O layers disposed on and under the oxide. According to the typical RTGG method, the piezoelectric ceramic as the final product inevitably includes the elements contained in the plate-like grains, and thus, when the Bi layered oxide is used as a raw material, only a piezoelectric ceramic containing Bi is obtained.

On the other hand, according to the method disclosed in Saito et al., at step 2, bismuth (Bi) in the crystal structures of the plate-like grains is substituted by sodium (Na) by topochemical conversion. Therefore, even when the Bi layered oxide is used as the first precursor, the final product containing no bismuth is obtained (see FIG. 2 of Saito et al.).

However, in the Bi layered oxide, bismuth is contained not only in the Bi—O layers but also in the perovskite block layer. Accordingly, as disclosed in Saito et al., when the second precursor is produced at step 2, it is unclear whether or not all of the bismuth are substituted by sodium. Further, it is also unclear, when bismuth remains in the second precursor, how the residual bismuth affects the piezoelectric property in the final product.

SUMMARY OF THE INVENTION

Accordingly, in view of the above-mentioned circumstances, a first purpose of the present invention is to improve the piezoelectric performance of a lead-free piezoelectric ceramic having a perovskite crystal structure expressed by the general formula $ABO_3$ and the B-site element including niobium. Further, a second purpose of the present invention is to make clear the influence on the piezoelectric performance in the piezoelectric ceramic by prescribing the content of bismuth element that is inevitably mixed in the final product according to the conventional technologies. Furthermore, a third purpose of the present invention is to provide a method of manufacturing a lead-free piezoelectric ceramic in which bismuth element is hard to remain and crystals are uniaxially oriented.

In order to solve the above-mentioned problems, a piezoelectric ceramic according to one aspect of the present invention is a piezoelectric ceramic having a perovskite-type crystal structure in which plural octahedrons formed of oxygen are arranged to share vertices thereof and elements are located at a center of eight octahedrons and at a center of each octahedron; wherein an element located at the center of eight octahedrons is A-site element, an element located at the center of each octahedron is B-site element, and a general formula of the perovskite-type crystal structure is $ABO_3$; the B-site element includes niobium (Nb); and bismuth (Bi) content in composition of the piezoelectric ceramic is 100 ppm by weight or less.

Further, a method according to one aspect of the present invention is a method of manufacturing a piezoelectric ceramic and the method comprises the steps of: (a) preparing plate-like grains of a compound having a layered perovskite-type crystal structure in which plural octahedrons formed of oxygen are arranged to share vertices thereof and elements are located at a center of eight octahedrons and at a center of each octahedron, wherein an element located at the center of eight octahedrons is A'-site element, an element located at the center of each octahedron is B-site element, and a general formula of the layered perovskite-type crystal structure is $(Bi_2O_2)(A'_{n-1}B_nO_{3n+1})$, where "n" is an integer from 2 to 5, the A'-site element and the B-site element include no bismuth (Bi), and the B-site element includes niobium (Nb); (b) heat-treating the plate-like grains prepared at step (a) in molten flux and replacing bismuth (Bi) and the A'-site element with at least one other element to generate plate-like grains having a perovskite-type crystal structure in which plural octahedrons formed of oxygen are arranged to share vertices thereof and elements are located at a center of eight octahedrons and at a center of each octahedron, wherein an element located at the center of eight octahedrons is A-site element, an element located at the center of each octahedron is the B-site element, and a general formula of the perovskite-type crystal structure is $ABO_3$; and (c) fabricating a compact containing the plate-like grains generated at step (b) and sintering the compact.

In the present application, the plate-like grains refer to particles each having a thickness one-third a length of a side or a diameter of the principal surface. According to the present invention, a lead-free piezoelectric ceramic exhibiting practical piezoelectric performance can be obtained by suppressing lower the bismuth content in the perovskite crystals having the B-site element including niobium. Further, according to the present invention, since the layered perovskite crystals including no bismuth at the predetermined site are used as precursors, the piezoelectric ceramic, in which the bismuth content is suppressed lower and the crystals are uniaxially oriented, can be obtained.

BRIEF DESCRIPTION OF THE DRAWINGS

FIG. 4 shows results of experiments of fabricating working examples and comparative examples.

DESCRIPTION OF THE PREFERRED EMBODIMENTS

Figure 1:
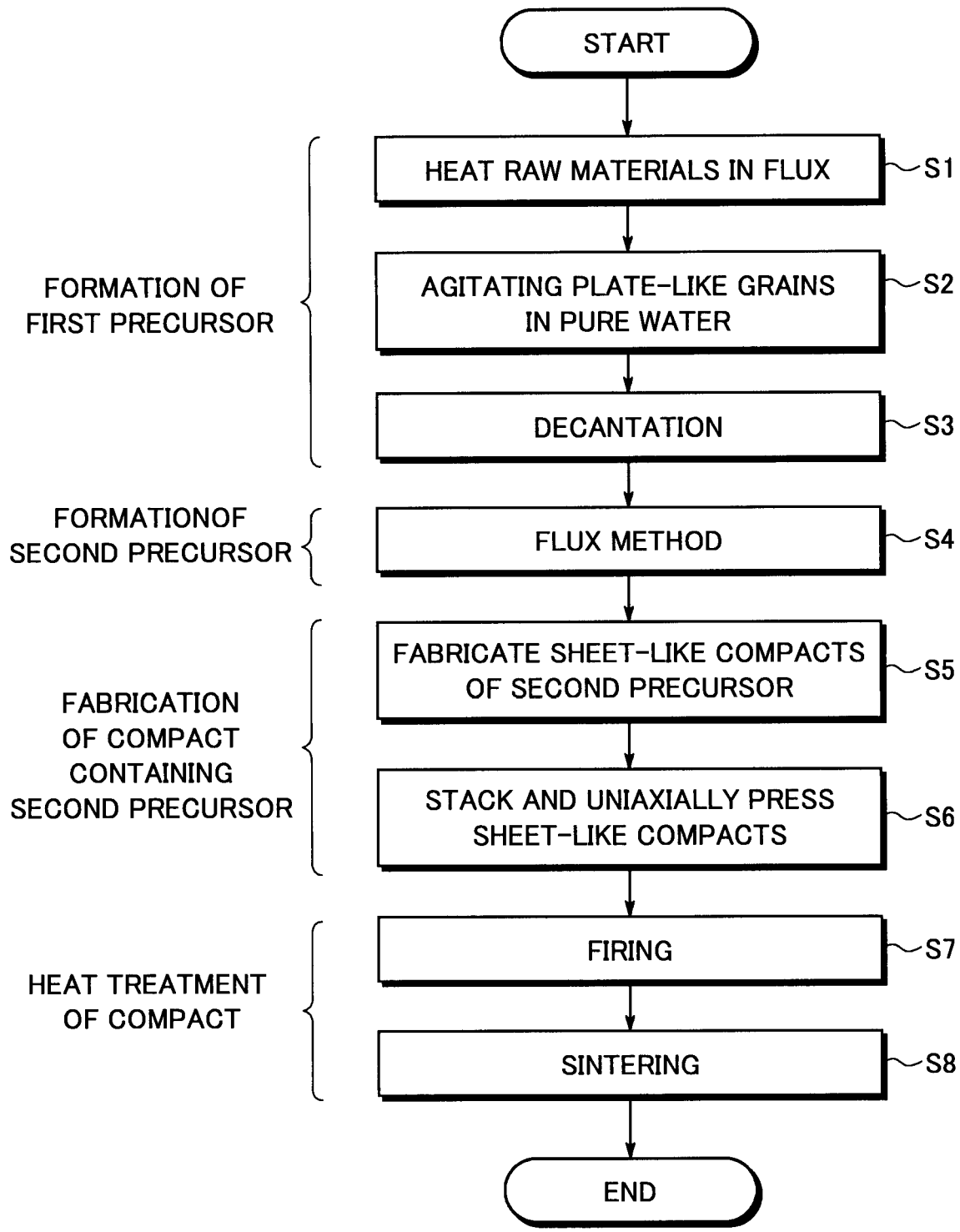
FIG. 1 is a flowchart showing a method of manufacturing a piezoelectric ceramic according to one embodiment of the present invention.

Hereinafter, preferred embodiments of the present invention will be explained in detail by referring to the drawings. The same reference numerals are assigned to the same component elements and the description thereof will be omitted.

FIG. 1 is a flowchart showing a method of manufacturing a piezoelectric ceramic according to one embodiment of the present invention. Further, FIGS. 2A-2D are diagrams for explanation of the method of manufacturing a piezoelectric ceramic according to the embodiment. The manufacturing method is a method of manufacturing a piezoelectric ceramic having a perovskite-type crystal structure expressed by a general formula $ABO_3$, where the B-site element includes niobium (Nb), and bismuth (Bi) content in the piezoelectric ceramic composition is 100 ppm by weight or less. Furthermore, according to the method, a piezoelectric ceramic with good orientation, for example, a piezoelectric ceramic with the degree of orientation F of 50% or more according to the Lotgering method can be manufactured.

As specific compositions, for example, $KNbO_3$, $K_{0.5}Na_{0.5}NbO_3$, or $(K_{0.5}Na_{0.5})_{1-x}Li_x(Nb_{1-y}Ta_yO_3)$ (x=0 to 0.1, y=0 to 0.5) formed by substituting lithium (Li) for the A-site and tantalum (Ta) for the B-site of $K_{0.5}Na_{0.5}NbO_3$ are cited. The calculation method of the degree of orientation according to the Lotgering method will be explained later.

Figure 2A:
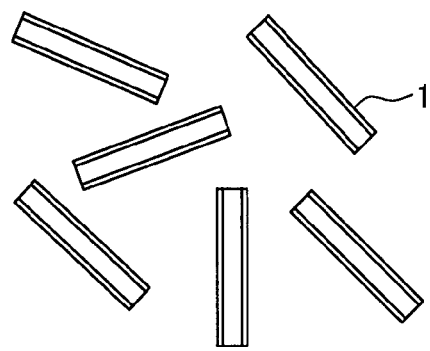
FIGS. 2A-2D are diagrams for explanation of the method of manufacturing a piezoelectric ceramic according to the one embodiment.

First, at steps S1 to S3 of FIG. 1, as shown in FIG. 2A, plate-like grains 1 as a first precursor of a piezoelectric ceramic are prepared. The first precursor is a compound (Bi layered oxide) having a layered perovskite crystal structure expressed by the general formula $(Bi_2O_2)(A'_{n-1}B_nO_{3n+1})$, including an alkaline earth element at the A'-site and niobium at the B-site. Here, "n" is an integer from 2 to 5, and, for n=2, the composition formula is $Bi_2XNb_2O_9$, for example. Further, the first precursor is characterized by including no bismuth at the A'-site. Since the layered perovskite crystal structure has high anisotropy, and the plate-like grains are easily formed.

Figure 3:
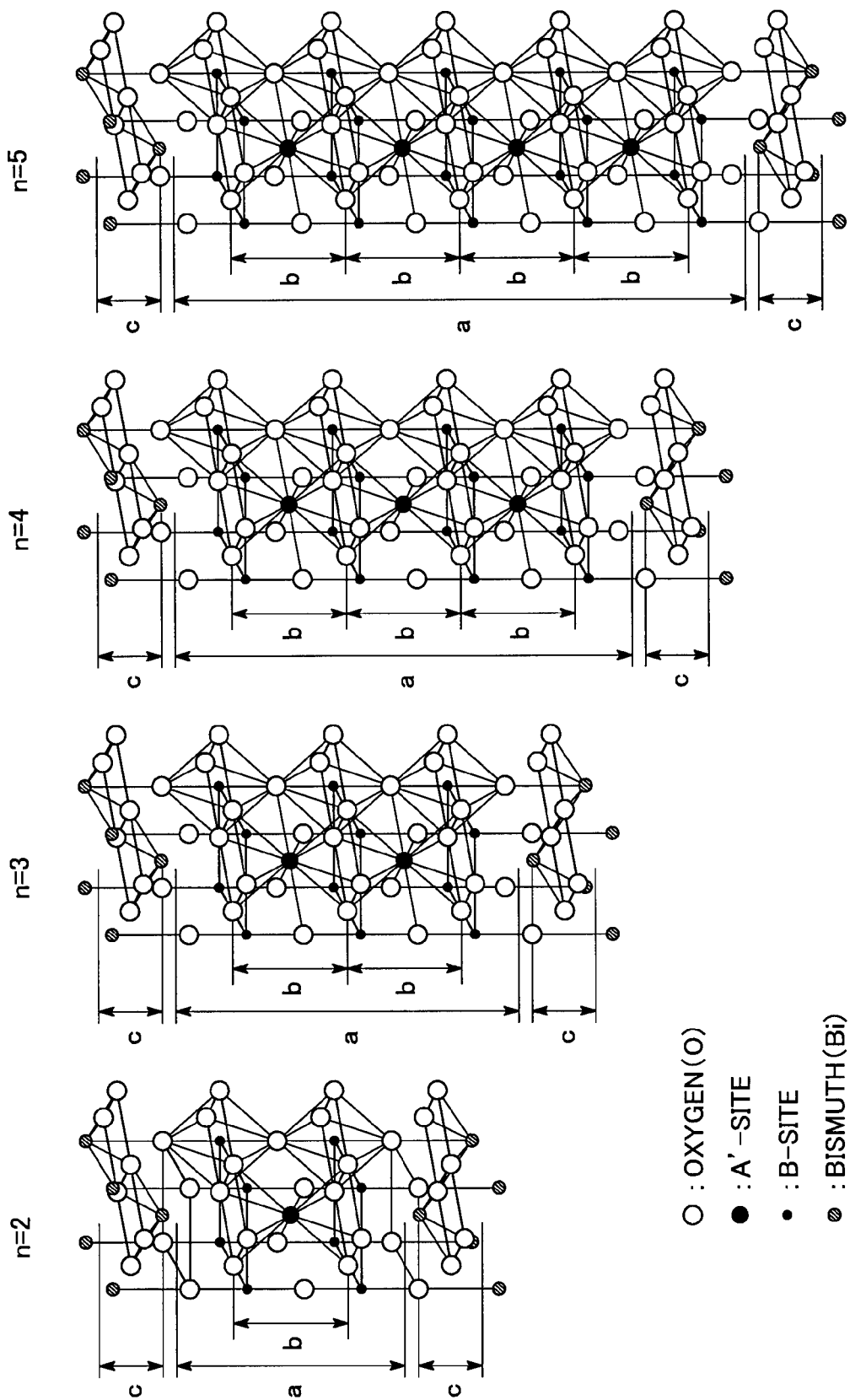
FIG. 3 is a schematic view showing a layered perovskite crystal structure.

FIG. 3 is a schematic view showing a layered perovskite crystal structure. In the above general formula, $A'_{n-1}B_nO_{3n+1}$ expresses a composition of a perovskite block layer ("a" shown in FIG. 3) in which octahedrons with oxygen (O) at vertices are arranged in a sheet-like formation, and $Bi_2O_2$ expresses a composition of Bi—O layers ("c" shown in FIG. 3) located on and under the perovskite block layer. Further, "b" shown in FIG. 3 expresses one unit structure of the perovskite block layer.

As shown in FIG. 3, at centers of the respective octahedrons (B-site) in the perovskite block layer and near centers of the arranged eight octahedrons (A'-site), the following ions are respectively located according to "n" (n=2 to 5) of the above general formula.

For n=2 A'-site: di-valent ion, B-site: penta-valent ion
For n=3 A'-site: tri-valent ion, B-site: tetra-valent ion or
    A'-site: 3/2-valent ion, B-site: penta-valent ion
For n=4 A'-site: 8/3-valent ion, B-site: tetra-valent ion or
    A'-site: 4/3-valent ion, B-site: penta-valent ion
For n=5 A'-site: 5/2-valent ion, B-site: tetra-valent ion or
    A'-site: 5/4-valent ion, B-site: penta-valent ion In the first precursor having such a structure, the reason why the A'-site contains no bismuth is as follows. That is, in the embodiment, at the subsequent step, the Bi—O layers are caused to disappear by substituting other elements for bismuth in the Bi—O layers of the first precursor (topochemical reaction). However, in the case where bismuth is also located at the A'-site in the perovskite block layer, the bismuth is not always completely substituted by other elements in the topochemical reaction, and therefore, bismuth can remain in the final product. Accordingly, in the embodiment, a material including no bismuth at the A'-site is prepared as the precursor.

For example, when $K_{0.5}Na_{0.5}NbO_3$ is manufactured as the final product, $(Bi_2O_2)(CaNb_2O_7)$ is prepared as the first precursor.

Referring to FIG. 1 again, in the embodiment, the first precursor is fabricated by using the halide flux method. For the purpose, first, at step S1, carbonate and oxide are prepared as raw materials and they are heated in alkali halide (halogenide) such as NaCl, KCl, etc. The alkali halide melts at a high temperature. For example, in the eutectic composition at a molar ratio of NaCl:KCl=1:1, the melting point is 650° C. In the case where the compound to be fabricated (the first precursor) is thermodynamically more stable than the raw material dissolved in the molten flux, by holding the alkali halide at the melting point thereof or higher, the compound is deposited in the melt.

In this regard, in the case where the crystal anisotropy of the compound is large as that of the Bi layered oxide, the crystal growth speed varies depending on the crystal orientation. Accordingly, in the case where the crystal is in the environment such as melt in which the crystal is able to freely grow without restriction on the growth, the plate-like grains (the first precursor) can be obtained relatively easily. The shape and size of the plate-like grains vary depending on the compound, and generally, larger plate-like grains are obtained as the holding temperature is higher and the holding time is longer. Note that, if the temperature is too high, the decomposition reaction into different materials may occur due to the thermodynamic stability of the compound, and thus, it is necessary to appropriately select the heat treatment condition.

Then, at step S2, the first precursor (plate-like grains) generated at step S1 is agitated in pure water. Here, since the alkali halide is water-soluble, impurities are removed at the step and only the plate-like grains can be obtained in the solid state.

Furthermore, at step S3, the water-soluble impurities are removed by performing decantation on the first precursor agitated in pure water. Here, the decantation refers to work of leaving mixture of liquid material and solid material to settle the solid material and washing out only the supernatant liquid in order to separate the solid material of precipitation and so on from the liquid material. At step 3, in order to extremely reduce the water-soluble impurities, water washing and filtration are desirably repeated at least at ten times. Alternatively, instead of decantation, the pure water in which the first precursor has been precipitated may be filtered. Thereby, the first precursor 1 shown in FIG. 2A is obtained.

Figure 2B:
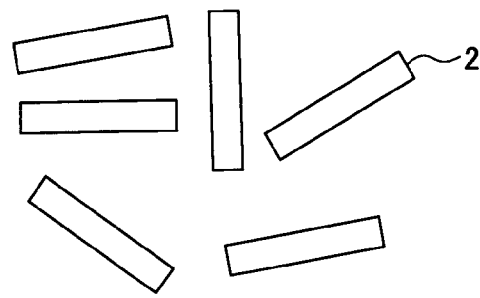

Then, at step S4 of FIG. 1, in the similar manner to that at step S1, plate-like grains as the second precursor are fabricated based on the first precursor by using the molten flux method. For the purpose, sodium-carbonate, potassium-carbonate, and the first precursor obtained at step S3 are prepared, and they are heated in alkali halide. Thereby, the Bi—O layer of the first precursor disappears and the A'-site is substituted by sodium and potassium, and the first precursor transforms into pseudo-equiaxial crystals while keeping the shape of the plate-like grains. Thereby, as shown in FIG. 2B, the second precursor 2 is obtained.

Then, at steps S5 to S8 of FIG. 1, an orientation controlled-piezoelectric ceramic compact is fabricated based on the second precursor. For the purpose, the green sheet method is used in the embodiment.

At step S5, slurry is fabricated by mixing the second precursor and an additive with a binder and a plasticizer, molded in a sheet-like shape (or tape-like shape), and dried. Here, the additive includes a material solid-solved in a ceramic crystal for altering the composition of the crystal and a material not solid-solved in the crystal but existing in the crystal grain boundary and having a sintering auxiliary agent for improving the degree of sintering. Further, as the additive used at the time, oxide is preferably used for improving the density of the compact. Furthermore, the particle size of the additive is preferably set to 1 μm or less such that the orientation of the plate-like grains as the second precursor may be not disturbed.

Figure 2C:
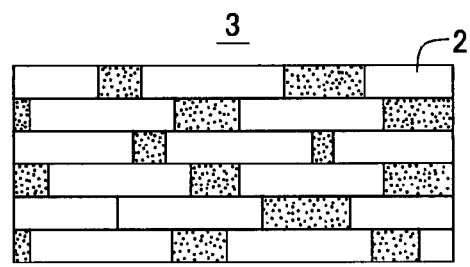
Figure 2D:
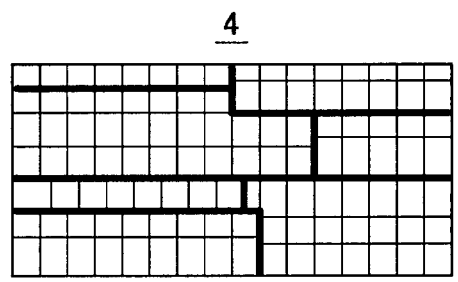

At step S6, the desired number of dried sheet-like compacts are stacked and uniaxially pressed. Thereby, as shown in FIG. 2C, the compact (ceramic green) 3 including the second precursor is obtained.

Furthermore, at step S7, the compact 3 including the second precursor is heat-treated (fired) at a predetermined temperature (e.g., about 200° C. to 300° C.), and thus, the binder is scattered.

Then, in order to obtain the denser sintered material, at step S8, the debindered compact is uniaxially pressed again and heat-treated (sintered) at a predetermined temperature (e.g., about 900° C. to 1200° C.). Thereby, the piezoelectric ceramic (sintered material) 4 is obtained.

In the above explained method of manufacturing a piezoelectric ceramic, at the fabrication steps of the first precursor (steps S1 to S3), other methods than the alkali halide flux method may be used as long as plate-like (layered) grains can be obtained. For example, the bismuth oxide flux method or sulfate flux method may be used. When the bismuth oxide flux method is used, the bismuth oxide as flux is dissolved by using dilute hydrochloric acid or the like not by water washing.

Further, the fabrication steps of the compact including the second precursor (steps S5 to S8), known orientation molding technologies such as uniaxial pressing molding method or extrusion method may be used.

Furthermore, in the embodiment, as the first precursor, for example, a compound such as $Bi_2XYNb_3O_{12}$, $Bi_2XY_2Nb_4O_{15}$, or $Bi_2XY_3Nb_5O_{18}$ may be used. Here, X is an alkaline earth element and Y is an alkaline element.

Using the method of manufacturing a piezoelectric ceramic according to one embodiment of the present invention, a piezoelectric ceramic $K_{0.47}Na_{0.47}Li_{0.06}Nb_{0.8}Ta_{0.2}O_3$ has been manufactured, and evaluations have been made in viewpoints of composition, degree of crystal orientation, and piezoelectric property. As below, evaluation method of these properties will be explained.

(a) Composition

The composition of the piezoelectric ceramic was measured by using ICP (high-frequency inductively-coupled plasma) emission spectrometry. However, Sodium (Na), potassium (K) and lithium (Li) were measured using the atomic absorption method.

(b) Degree of Crystal Orientation

Using the X-ray diffraction method with a Cu—K α-ray source, the intensity of the diffraction line in the range of $10°≦2θ≦60°$ was measured, and the degree of crystal orientation was obtained based on the measurement value by the Lotgering method. Here, in the Lotgering method, the degree of crystal orientation F is obtained by the equations (1)-(3).

$$P=\Sigma I'(HKL)/\Sigma I(HKL) \tag{1}$$

$$P=\Sigma I_0'(HKL)/\Sigma I_0(HKL) \tag{2}$$

$$F(\%)=100\times(P-P_0)/(1-P_0) \tag{3}$$

Here, I (HKL) represents the X-ray diffraction intensity from the crystal face (HKL) of an orientation sample, $I_0$ (HKL) represents the X-ray diffraction intensity from the crystal face (HKL) of a non-orientation compound having the same composition as that of the sample. Further, $\Sigma I'(HKL)$ represents the summation of the X-ray diffraction intensity from the orientation faces in cubic crystal representation (e.g., I(001), I(006), and so on) in the sample, and $\Sigma I(HKL)$ represents the summation of the X-ray diffraction intensity from all the crystal faces that can be measured in the sample. Furthermore, P represents the ratio of the X-ray diffraction intensity from the oriented face to the X-ray diffraction intensity from all the crystal faces, and $P_0$ represents the ratio of the X-ray diffraction intensity from the oriented face to the X-ray diffraction intensity from all the crystal faces in the non-orientation compound having the same composition as that of the sample. Therefore, F=0(%) in the non-orientation crystal, and F=100(%) when all the crystallites are oriented.

(c) Piezoelectric Property

Electrodes were formed by burning silver (Ag) paste into upper and lower surfaces of a sample polished in thickness of 1 mm, and polarization treatment was performed in the thickness direction of the sample with electrodes. The polarization treatment was performed by applying a direct-current voltage of about 4 kV to the sample for about 30 minutes in an insulating oil at about 200° C., and then, cooling the sample to the room temperature while keeping the application of the voltage in the insulating oil. The polarized sample is cut in 0.5 mm-widths, and the electric field induced strain generated when an electric field of 3 kV/mm was applied in the polarization direction at room temperature was measured, and the piezoelectric constant $d_{33}$ was obtained based on the measurement value.

WORKING EXAMPLE 1-1

(i) Fabrication of First Precursor

As raw materials, $Bi_2O_3$, $CaCO_3$, $Nb_2O_5$, $Ta_2O_5$ at purity equal to or greater than 99.9% were prepared, and they were weighed at a molar ratio of 1:1:0.8:0.2. Then, using the mixture of KCl and NaCl at an equal molar ratio as flux, the weighed raw materials and the flux were formulated in equal weights and mixed well. Further, the mixture of the raw materials and the flux were heat-treated for five hours at 1100° C. in the air. The resulting heat-treated material was water-washed and decanted repeatedly at ten times, and thereby, solid powder was obtained. From chemical analysis and X-ray diffraction performed on the solid powder, it has been confirmed that the solid powder is tetragonal having lattice constants of a=5.481 Å and c=24.81 Å, and that the solid powder is $(Bi_2O_2)(CaNb_{1.6}Ta_{0.4}O_7)$ crystal. Further, from SEM (scanning electron microscopy) observation, it has been confirmed that the solid powder has a square or substantially square plate-like shape in which the flat plate part has a side length of about 10 μm to 15 μm and a thickness of about 1 μm. The plate-like grains were used as the first precursor.

(ii) Fabrication of Second Precursor

As raw materials, $Na_2CO_3$ and $K_2CO_3$ at purity equal to or greater than 99.9% and the previously fabricated first precursor were prepared, and they were weighed at a molar ratio of 1:1:1. Then, using the mixture of KCl and NaCl at an equal molar ratio as flux, the weighed raw materials and the flux were formulated in equal weights and mixed well. Further, the mixture of the raw materials and the flux were heat-treated for three hours at 900° C. in the air. The resulting heat-treated material was water-washed and decanted repeatedly at ten times, and thereby, solid powder was obtained. From chemical analysis and X-ray diffraction performed on the solid powder, it has been confirmed that the solid powder is $K_{0.5}Na_{0.5}Nb_{0.8}Ta_{0.2}O_3$ crystal. Further, from SEM (scanning electron microscopy) observation, it has been confirmed that the solid powder has square or substantially square plate-like shape in which the flat plate part has a side length of about 5 μm to 10 μm and a thickness of about 1 μm. The plate-like grains were used as the second precursor.

(iii) Fabrication of Compact Containing Second Precursor

Separately fabricated $LiNbO_3$ powder having an average particle size of about 0.3 μm and the above second precursor were weighed at a molar ratio of 6:94 and mixed. The mixed raw material, ethanol as a solvent, PVB (polyvinyl butyral) as a binder, and DBP (dibutyl phthalate) as a plasticizer were mixed for fabricating slurry. Then, the slurry was sheet-molded by using the doctor blade method and dried such that the thickness of the green sheet after drying was 70 μm to 80 μm. Forty of thus formed green sheets were stacked and applied with pressure of 50 MPa in the thickness direction, and thereby, a ceramic green (compact containing the second precursor) was fabricated.

(iv) Heat Treatment of Ceramic Green

The temperature of the above-mentioned ceramic green was gradually raised to 300° C. for binder-firing treatment. Furthermore, the debindered compact is applied with pressure of 200 MPa in the thickness direction for densification and sintering treatment was performed at 1120° C. thereon. Thereby, a piezoelectric ceramic sample $K_{0.47}Na_{0.47}Li_{0.06}Nb_{0.8}Ta_{0.2}O_3$ has been obtained.

WORKING EXAMPLE 1-2

At step (i) of fabricating the first precursor, the size of the first precursor was changed from that of the working example 1-1 by changing the temperature at the time of heat treatment. That is, the heat treatment temperature was set to 1030° C., and thereby, the first precursor has been obtained in which the flat plate part has a side length of about 3 μm to 8 μm and a thickness of about 0.5 μm. Other steps were similar to those in the working example 1-1, and a piezoelectric ceramic sample $K_{0.47}Na_{0.47}Li_{0.06}Nb_{0.8}Ta_{0.2}O_3$ has been obtained.

WORKING EXAMPLE 2-1

At step (i) of fabricating the first precursor, $BaCO_3$ was used as the raw material in place of $CaCO_3$ in the working example 1. Further, the heat treatment temperature was set to 1050° C. From chemical analysis and X-ray diffraction performed on the solid powder obtained at this fabricating step (i), it has been confirmed that the solid powder is tetragonal having lattice constants of a=5.521 Å and c=25.52 Å, and that the solid powder is $(Bi_2O_2)(BaNb_{1.6}Ta_{0.4}O_7)$ crystal. Further, from SEM observation, the shape and size of the solid powder were the same as those of the working example 1-1. Other steps were similar to those in the working example 1-1, and a piezoelectric ceramic sample $K_{0.47}Na_{0.47}Li_{0.06}Nb_{0.8}Ta_{0.2}O_3$ has been obtained.

WORKING EXAMPLE 2-2

At step (i) of fabricating the first precursor, the size of the first precursor was changed from that of the working example 2-1 by changing the temperature at the time of heat treatment. That is, the heat treatment temperature was set to 950° C., and thereby, the first precursor has been obtained in which the flat plate part has a side length or a diameter of about 3 μm to 5 μm and a thickness of about 0.5 μm. Other steps were similar to those in the working example 1-1, and a piezoelectric ceramic sample $K_{0.47}Na_{0.47}Li_{0.06}Nb_{0.8}Ta_{0.2}O_3$ was obtained.

WORKING EXAMPLE 3-1

A piezoelectric ceramic sample was fabricated by using the typical solid-phase reaction sintering method. First, $Na_2CO_3$, $K_2CO_3$, $Li_2CO_3$, $Nb_2O_5$, and $Ta_2O_5$ at purity equal to or greater than 99.9% were prepared as raw materials, and they were weighed at a molar ratio of 47:47:6:80:20 and mixed. Then, a powder compact obtained by powder compacting molding the mixed raw materials was sequentially heat treated at temperatures of 750° C. and 900° C. for preliminary sintering. Furthermore, the preliminarily sintered material was crushed, and CIP (cold isostatic press) molding was performed at pressure of 200 MPa by employing the resulting powder and the same sintering heat treatment (heat treatment at 750° C. and 900° C.) was performed on the compact. Thereby, the piezoelectric ceramic sample $K_{0.47}Na_{0.47}Li_{0.06}Nb_{0.8}Ta_{0.2}O_3$ has been obtained. Note that the raw materials of the sample include no bismuth.

COMPARATIVE EXAMPLE 1-1

A sample was fabricated in the same manner as disclosed in Saito et al., "Lead-free piezoceramics". First, the first precursor including bismuth at A'-site was fabricated by synthesizing the raw material by using molten NaCl as flux. The heat treatment temperature at this time was set to 1080° C. From chemical analysis and X-ray diffraction performed on the resulting solid powder, it has been confirmed that the solid powder is tetragonal having lattice constants of a=3.900 Å and c=48.45 Å, and that the solid powder is $(Bi_2O_2)\{(Bi_{0.125}Na_{0.875})_4(Nb_{0.8}Ta_{0.2})_5O_{15}\}$ crystal including bismuth at the A'-site. Further, from SEM observation, the solid powder has the same square or substantially square plate-like shape as those in the working examples 1-1 to 2-2 in which the flat plate part has a side length of about 10 μm to 15 μm and a thickness of about 0.5 μm to 1 μm. The thickness is slightly smaller than that of the first precursor fabricated in the working examples 1-1 and 2-1. Then, $Na_2CO_3$ and the previously fabricated first precursor were prepared as raw materials, they were weighed at a molar ratio of 75:100 and heated at 900° C. by using NaCl having the same weight as that of the raw materials as flux, and thereby, plate-like $NaNb_{0.8}Ta_{0.2}O_3$ as the second precursor has been obtained. The shapes and sizes of the plate-like grains were generally the same as those of the first precursor. Furthermore, in order to fabricate a compact containing the second precursor, separately fabricated $LiNbO_3$ powder having an average particle size of about 0.3 μm, $KNbO_3$ powder, $KTaO_3$ powder, and the above second precursor were weighed at a molar ratio of 6:37:10:47 and mixed. The subsequent steps were similar to those in the working example 1-1, and a piezoelectric ceramic sample $K_{0.47}Na_{0.47}Li_{0.06}NbO_8Ta_{0.2}O_3$ has been obtained.

COMPARATIVE EXAMPLE 1-2

The first precursor having a different size from that of the working example 2-1 was fabricated by using the same method as that of the working example 2-1 while changing the temperature at the time of synthesizing of the first precursor. That is, the heat treatment temperature was set to 1000° C., and thereby, the first precursor has obtained in which the flat plate part has a side length of about 3 μm to 5 μm and a thickness of about 0.2 μm to 0.5 μm. Other steps were similar to those in the working example 1-1, and a piezoelectric ceramic sample $K_{0.47}Na_{0.47}Li_{0.06}Nb_{0.8}Ta_{0.2}O_3$ has been obtained.

FIG. 4 shows results of experiments of fabricating working examples and comparative examples. By comparison between the working example 1-1 and working example 1-2 or between the working example 2-1 and working example 2-2, the higher the heat treatment temperature at the time of fabrication of the first precursor is made, the larger the size of the first precursor (principally, the side length or diameter of the flat plate part) becomes. Thereby, the degree of orientation becomes higher in the final product (81% in the working example 1-1 and 78% in the working example 2-1), and the bismuth content increases with the degree. However, regarding the piezoelectric constant, in the case where the degree of orientation and the bismuth content are within the range of the result, the piezoelectric constant of 250 pm/V or more enough for practical use was obtained.

On the other hand, regarding the comparative example 1-1, the degree of orientation is high and the bismuth content rather increases, and thus, the piezoelectric constant is much lower than those in the working examples. Further, regarding the comparative example 1-2, the degree of orientation is not so high and the bismuth content exceeds 10 ppm by weight, and thus, the piezoelectric constant is drastically lower.

Furthermore, regarding the working example 3-1, since little bismuth (less than the detection limit) is contained, it exhibits the higher piezoelectric performance than those of the orientation-controlled comparative examples although no orientation control is made. Therefore, it has been confirmed that the performance of the piezoelectric ceramic can be improved by suppressing the bismuth content at a lower level.

As shown in the above results, it has been confirmed that, in the piezoelectric ceramic expressed by the general formula $ABO_3$ and including niobium at B-site, when the bismuth content is 100 ppm by weight or less and/or the degree of orientation is 50% or more, the practical piezoelectric constant value is obtained.

Next, application examples of the piezoelectric ceramic according to the embodiment will be explained.

A piezoelectric element can be fabricated by forming electrodes on both sides of the piezoelectric ceramic according to the embodiment. Further, when the piezoelectric ceramic is orientation-controlled, high piezoelectric performance can be obtained by locating the electrodes such that an electric field is applied in the crystal orientation direction. The piezoelectric element is applicable to a piezoelectric actuator, ultrasonic transducer for transmitting and receiving ultrasonic waves, and so on as is the case of a conventional lead piezoelectric ceramic element (e.g., PZT).

Figure 5:
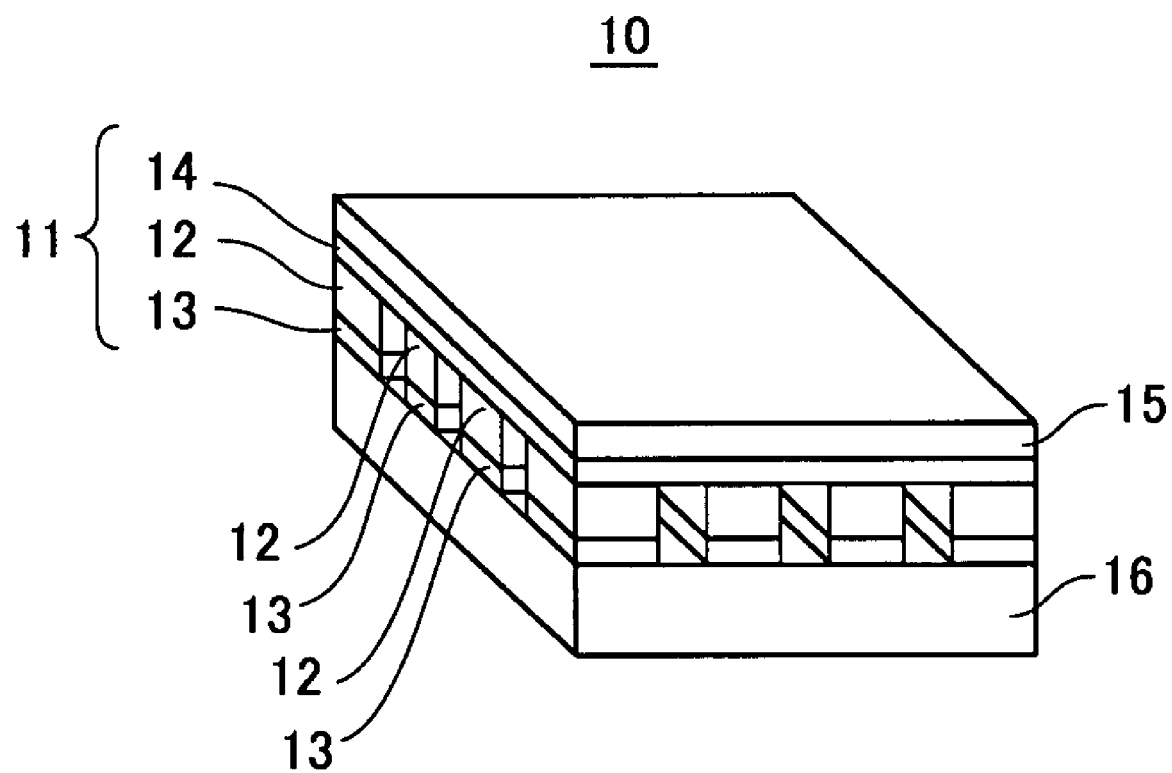
FIG. 5 is a diagram showing internal construction of an ultrasonic probe including ultrasonic transducers employing the piezoelectric ceramic according to one embodiment of the present invention.

FIG. 5 is a diagram showing internal construction of an ultrasonic probe including ultrasonic transducers employing the piezoelectric ceramic according to one embodiment of the present invention. As shown in FIG. 5, each ultrasonic transducer 11 is configured of a piezoelectric ceramic 12 for expanding and contracting due to the piezoelectric effect to transmit ultrasonic waves, and a discrete electrode 13 and a common electrode 14 respectively formed on both sides of the piezoelectric ceramic 12. Generally, the common electrode 14 is connected to the earth line. The ultrasonic probe 10 includes plural ultrasonic transducers 11, an acoustic matching layer 15 for matching acoustic impedance between the ultrasonic transducers 11 and an object to be inspected to make a transmission efficiency of ultrasonic waves higher, and backing material 16 for attenuating unnecessary ultrasonic waves generated from the ultrasonic transducers 11.

The piezoelectric element employing the piezoelectric ceramic according to the embodiment has a possibility to give the performance comparable to the piezoelectric element employing the lead piezoelectric ceramic. For example, there is PZT having piezoelectric constant $d_{33}$ of about 400 pm/V, however the performance with piezoelectric constant $d_{33}$ of about 380 pm/V is realized in the embodiment.

Further, since the piezoelectric ceramic obtained in the embodiment contains no lead, it is harmless to humans and environments. Therefore, handling of devices can be made easier in the manufacturing process of piezoelectric ceramics, in the manufacturing process of devices to which the piezoelectric ceramics are applied, in the distribution process of the devices, at the time of use of the devices, and after disposal.

The invention claimed is:

1. A piezoelectric ceramic having a perovskite-type crystal structure in which plural octahedrons formed of oxygen are arranged to share vertices thereof and elements are located at a center of eight octahedrons and at a center of each octahedron;

wherein an element located at the center of eight octahedrons is A-site element, an element located at the center of each octahedron is B-site element, and a general formula of said perovskite-type crystal structure is $ABO_3$;

said B-site element includes niobium (Nb);

bismuth (Bi) content in composition of said piezoelectric ceramic is not larger than 100 ppm by weight; and said piezoelectric ceramic has a degree of orientation of not less than 50% when measured according to Lotgering method.

2. A piezoelectric element comprising:

a piezoelectric ceramic having a perovskite-type crystal structure in which plural octahedrons formed of oxygen are arranged to share vertices thereof and elements are located at a center of eight octahedrons and at a center of each octahedron, wherein an element located at the center of eight octahedrons is A-site element, an element located at the center of each octahedron is B-site element, and a general formula of said perovskite-type crystal structure is $ABO_3$, said B-site element includes niobium (Nb), and bismuth (Bi) content in composition of said piezoelectric ceramic is not larger than 100 ppm by weight; and two electrodes respectively formed on two opposite surfaces of said piezoelectric ceramic, wherein said piezoelectric ceramic has a degree of orientation of not less than 50% when measured according to Lotgering method.

3. A method of manufacturing a piezoelectric ceramic comprising the steps of:
(a) preparing plate-like grains of a compound having a layered perovskite-type crystal structure in which plural octahedrons formed of oxygen are arranged to share vertices thereof and elements are located at a center of eight octahedrons and at a center of each octahedron, wherein an element located at the center of eight octahedrons is A'-site element, an element located at the center of each octahedron is B-site element, and a general formula of said layered perovskite-type crystal structure is $(Bi_2O_2)(A'_{n-1}B_nO3,_{n+1})$, where "n" is an integer from 2 to 5, said A'-site element and said B-site element include no bismuth (Bi), and said B-site element includes niobium (Nb);
(b) heat-treating the plate-like grains prepared at step (a) in molten flux and replacing bismuth (Bi) and said A'-site element with at least one other element to generate plate-like grains having a perovskite-type crystal structure in which plural octahedrons formed of oxygen are arranged to share vertices thereof and elements are located at a center of eight octahedrons and at a center of each octahedron, wherein an element located at the center of eight octahedrons is A-site element, an element located at the center of each octahedron is said B-site element, and a general formula of said perovskite-type crystal structure is $ABO_3$; and
(c) fabricating a compact containing the plate-like grains generated at step (b) and sintering said compact.

4. A method according to claim 3, wherein step (c) includes fabricating said compact by using a green sheet method.

5. A method according to claim 3, wherein step (a) includes preparing plate-like grains of a compound expressed by a general formula $(Bi_2O_2)(A'_{n-1}B_nO_{3n+1})$, where n=2, said A'-site element includes alkaline earth element, and said B-site element includes niobium (Nb).

6. A method according to claim 3, wherein step (c) includes fabricating said compact by mixing an additive material into the plate-like grains formed at step (b).

7. A method of manufacturing a piezoelectric ceramic according to claim 6, wherein said additive material is oxide.

8. A piezoelectric ceramic manufactured by using the method according to claim 3.

9. A piezoelectric element comprising:
a piezoelectric ceramic manufactured by using the method according to claim 3; and
two electrodes respectively formed on two opposite surfaces of said piezoelectric ceramic such that an electric field is applied in the orientation direction of said piezoelectric ceramic.

* * * * *